(12) United States Patent
Marek et al.

(10) Patent No.: US 11,716,066 B2
(45) Date of Patent: Aug. 1, 2023

(54) COMPACT, HIGH-POWER THIN-FILM FILTER

(71) Applicant: KYOCERA AVX Components Corporation, Fountain Inn, SC (US)

(72) Inventors: Michael Marek, Jerusalem (IL); Elinor O'Neill, Mevaseret Zion (IL); Ronit Nissim, Jerusalem (IL)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

(21) Appl. No.: 17/545,067

(22) Filed: Dec. 8, 2021

(65) Prior Publication Data

US 2022/0190802 A1    Jun. 16, 2022

Related U.S. Application Data

(60) Provisional application No. 63/126,014, filed on Dec. 16, 2020.

(51) Int. Cl.
*H03H 7/01* (2006.01)

(52) U.S. Cl.
CPC ........ *H03H 7/0115* (2013.01); *H03H 7/1725* (2013.01); *H03H 7/1791* (2013.01)

(58) Field of Classification Search
CPC ......... H03H 7/0115; H03H 2001/0085; H03H 7/1725; H03H 7/1791
USPC .................................................. 333/175, 185
See application file for complete search history.

(56) References Cited

U.S. PATENT DOCUMENTS

| 5,347,238 A * | 9/1994 | Kobayashi ........... H03B 5/1203 333/214 |
| 11,108,368 B2 * | 8/2021 | Marek ..................... H03H 5/02 |
| 2003/0009863 A1 | 1/2003 | Figueredo et al. |
| 2011/0187449 A1 | 8/2011 | Koechlin |
| 2020/0295727 A1 | 9/2020 | Marek et al. |

FOREIGN PATENT DOCUMENTS

| CN | 107482289 | 12/2017 |
| KR | 1020110055273 | 5/2011 |

OTHER PUBLICATIONS

International Search Report for PCT/US2021/062534 dated Mar. 18, 2022, 10 pages.

* cited by examiner

*Primary Examiner* — Rakesh B Patel
(74) *Attorney, Agent, or Firm* — Dority & Manning, P.A.

(57) ABSTRACT

A thin-film filter may include a monolithic substrate and a patterned conductive layer formed over the monolithic substrate. The patterned conductive layer may include at least one thin-film inductor. The thin-film filter may have a power capacity that is greater than about 25 W. In some embodiments, the thin-film inductor(s) may be connected between the input port and the output port. A heat sink terminal may be exposed along the bottom surface of thin-film filter. In some embodiments, the heat sink terminal may have an exposed heat sink area, and the bottom surface of the thin-film filter has an area that is less than 20 times larger than the exposed heat sink area.

26 Claims, 6 Drawing Sheets

US 11,716,066 B2

COMPACT, HIGH-POWER THIN-FILM FILTER

CROSS REFERENCE TO RELATED APPLICATION

The present application claims filing benefit of U.S. Provisional Patent Application Ser. No. 63/126,014 having a filing date of Dec. 16, 2020, which is incorporated herein by reference in its entirety.

FIELD OF THE INVENTION

The present subject matter generally concerns thin-film filters. More particularly, the present subject matter relates to a compact high-power thin-film filter.

BACKGROUND OF THE INVENTION

High frequency radio signal communication has increased in popularity. A trend towards miniaturization has also increased the desirability of small, passive components and generally decreased the power handling capacity of such components. Miniaturization has also increased the difficulty of surface mounting small, passive components. Thus, a small, surface mountable filter having high power handling capacity would be welcomed in the art.

SUMMARY

In accordance with one embodiment of the present invention, a thin-film filter may include a monolithic substrate and a patterned conductive layer formed over the monolithic substrate. The patterned conductive layer may include at least one thin-film inductor. The thin-film filter may have a power capacity that is greater than about 25 W.

In accordance with another embodiment of the present invention, a thin-film filter may include a monolithic substrate, an input port exposed on a bottom surface of the thin-film filter, and an output port exposed on the bottom surface of the filter. The thin-film filter may include a patterned conductive layer formed over the monolithic substrate. The patterned conductive layer may include at least one thin-film inductor connected between the input port and the output port. The thin-film filter may include a heat sink terminal exposed along the bottom surface of the thin-film filter. The heat sink terminal may have an exposed heat sink area. A footprint area of the thin-film filter can be less than 20 times larger than the exposed heat sink area.

In accordance with another embodiment of the present invention, a method for forming a thin-film filter may include providing a monolithic substrate and forming a patterned conductive layer formed over the monolithic substrate. The patterned conductive layer may include at least one thin-film inductor connected between an input port exposed on a bottom surface of the thin-film filter and an output port exposed on the bottom surface of the thin-film filter. The method may include forming a heat sink terminal exposed along the bottom surface of the thin-film filter.

BRIEF DESCRIPTION OF THE DRAWINGS

A full and enabling disclosure of the present invention, including the best mode thereof, directed to one of ordinary skill in the art, is set forth in the specification, which makes reference to the appended Figures, in which.

Figure 1A:
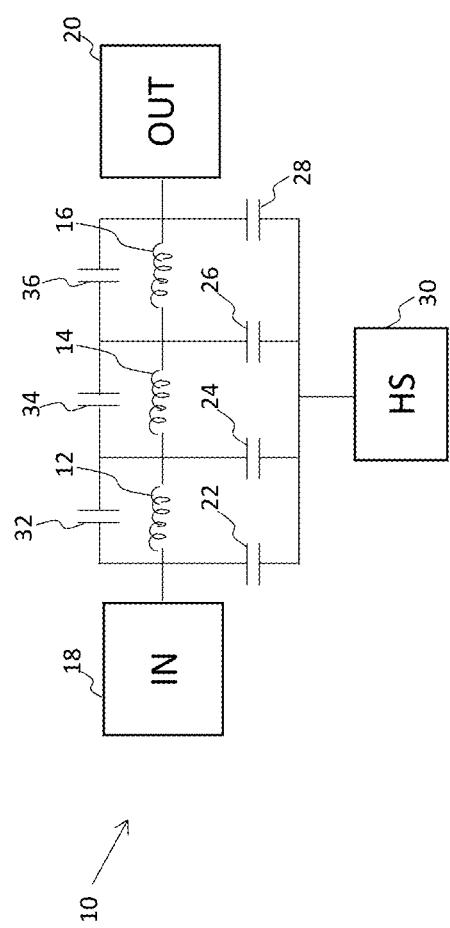
FIG. 1A illustrates a simplified schematic of a thin-film filter according to aspects of the present disclosure.

Repeat use of reference characters throughout the present specification and appended drawings is intended to represent same or analogous features or elements of the invention.

DETAILED DESCRIPTION OF REPRESENTATIVE EMBODIMENTS

A high-power thin-film filter is disclosed that has excellent power handling capabilities in a compact package. The thin-film filter can include a monolithic substrate and at least one thin-film inductor formed over the monolithic substrate. The thin-film filter can have a power capacity that is greater than about 25 W, in some embodiments greater than about 30 W, in some embodiments greater than about 40 W, in some embodiments greater than about 50 W, in some embodiments greater than about 75 W, in some embodiments greater than about 100 W, and in some embodiments greater than about 150 W.

The thin-film filter may be configured as a compact, surface-mountable device, for example using grid array-type mounting (e.g., land grid array (LGA) type mounting, ball grid array (BGA) type, etc.). This combination may be desirable for ease of mounting and/or for applications in which available mounting space on a printed circuit board is limited. For example, the thin-film filter may have a footprint area that is less than about 50 cm$^2$, in some embodiments less than about 45 cm$^2$, in some embodiments less than about 40 cm$^2$, in some embodiments less than about 35 cm$^2$, in some embodiments less than about 20 cm$^2$, in some embodiments less than about 15 cm$^2$, in some embodiments less than about 10 cm$^2$, and in some embodiments less than about 7 cm$^2$.

The filter may have a high power capacity relative to a footprint area of the filter in an X-Y plane. For example, the filter may have an area power capacity that is greater than about 0.02 W/mm$^2$, in some embodiments greater than about 0.1 W/mm$^2$, in some embodiments greater than about 0.15 W/mm$^2$, in some embodiments greater than about 0.2 W/mm$^2$, and in some embodiments greater than about 0.22 W/mm$^2$.

The filter may have a high power capacity relative to a volume of the filter. For example, the filter may have a volume power capacity that is greater than about 0.02 W/mm$^3$, in some embodiments greater than about 0.1 W/mm$^3$, in some embodiments greater than about 0.15 W/mm$^3$, in some embodiments greater than about 0.2 W/mm$^3$, and in some embodiments greater than about 0.22 W/mm$^3$.

The filter may include a variety of features contributing to high power capacity. The filter may include a patterned conductive layer forming one or more thin-film inductors. The thin-film inductors can be relatively thick for thin-film components. For example, in some embodiments the thin-film inductors can have a thickness that ranges from 20 micrometers to about 80 micrometers, in some embodiments from about 30 micrometers to about 70 micrometers, in some embodiments from about 40 micrometers to about 60 micrometers, and in some embodiments from about 45 micrometers to about 55 micrometers. Such thicknesses have been found to reduce heat generation by the thin-film inductors when large power currents are applied. Additionally, such thicknesses are not so large as to prevent strong adhesion between substrate and/or dielectric layers that are adjacent the thin-film inductors.

In contrast, the patterned conductive layers of other thin-film components, such as thin-film capacitors and/or resistive layers of thin-film resistors (if present) may have thicknesses in the Z-direction that range from about 0.05 micrometers to about 40 micrometers, in some embodiments from about 0.1 micrometers to about 20 micrometers, in some embodiments from about 0.3 micrometer to about 10 micrometers, and in some embodiments from about 1 micrometer to about 5 micrometers.

The thin film components may be precisely formed using a variety of suitable subtractive, semi-additive, or fully additive processes. For example, physical vapor deposition and/or chemical deposition may be used. For instance, in some embodiments, the thin film components may be formed using sputtering, a type of physical vapor deposition. A variety of other suitable processes may be used, however, including evaporation, atomic layer deposition (ALD), plasma-enhanced chemical vapor deposition (PECVD), electroless plating, and electroplating, for example. Lithography masks and etching may be used to produce the desired shape of the thin film components. A variety of suitable etching techniques may be used including dry etching using a plasma of a reactive or non-reactive gas (e.g., argon, nitrogen, oxygen, chlorine, boron trichloride, carbon tetrafluoride, sulfur hexafluoride) and/or wet etching.

The thin-film inductor may include a patterned conductive layer forming a loop. The loop may have a single loop diameter that ranges from about 2 mm to about 9 mm, in some embodiments from about 3 mm to about 7 mm. In some embodiments, the thin-film inductor(s) may include a patterned conductive layer shaped in a loop that is formed entirely on a single layer. For example, multiple thin-film inductors may be formed entirely in the same patterned conductive layer and/or plane. However, in other embodiments, the thin-film inductor(s) can respectively include at least two patterned conductive layers spaced apart from each other in a thickness direction of the thin-film filter and connected by one or more vias. The patterned conductive layers may be spaced apart by one or more dielectric layers, including one or more suitable dielectric materials, including those described above with respect to the substrate.

The thin-film inductor(s) may have a line width a width in the X-Y plane that is greater than about 0.1 mm, in some embodiments greater than about 0.2 mm, in some embodiments greater than about 0.3 mm, and in some embodiments greater than about 0.5 mm, and in some embodiments greater than about 1 mm.

As another example of a feature that can improve the power capacity of the filter, the filter can have a heat sink terminal exposed along a bottom surface of the filter. The heat sink terminal can be configured to be attached (e.g., soldered) to a heat sink of a printed circuit board or other mounting surface. The heat sink terminal can have an exposed heat sink area that is relatively large with respect to the filter. For example, the filter can have a footprint area that is less than about 20 times larger than the exposed heat sink area, in some embodiments less than about 15 times larger, in some embodiments less than about 10 times larger, and in some embodiments less than 5 times larger. The exposed heat sink area can be about 5% or more of the footprint area of the filter, in some embodiments 7% or more, and in some embodiments about 10% or more.

Additionally, the exposed heat sink terminal can be relatively long such that heat can be more evenly removed from the filter. This configuration can improve the heat capacity of the filter by reducing an operating temperature of the filter at a given power. For example, the monolithic substrate can have a length in a first direction, and the heat sink terminal can have a heat sink length in a first direction and the monolithic substrate having a length in the first direction, and wherein a ratio of the length of the monolithic substrate to the heat sink length is less than about 2, in some embodiments less than about 1.7, in some embodiments less than about 1.5, in some embodiments less than about 1.3, and in some embodiments less than about 1.1. In other words, in some embodiments the length of the heat sink terminal can be about 50% or more of the length of the filter, in some embodiments about 70% or more, in some embodiments about 80% or more, and in some embodiments about 90% or more.

In some embodiments, the heat sink terminal can act as a ground of the thin-film filter. The heat sink terminal can be connected with a ground of the device (e.g., printed circuit board) to which the thin-film filter is connected. However, in other embodiments, a ground terminal that is distinct from the heat sink terminal can facilitate a ground connection with the device to which the thin-film filter is connected. In such embodiments, one or more capacitors may be formed between the inductors and the ground terminal.

The input and output ports of the thin-film filter may also be relatively large to aid in removing heat from the thin-film filter to the printed circuit board. For example, the input port can have an exposed input port area for connection with the printed circuit board. The output port can have an exposed output port area for connection with the printed circuit board. The bottom surface of the filter can have an area that is less than 150 times larger than a port exposed area, which can be defined as a sum of the exposed input port area and the exposed output port area, in some embodiments less than 120 times larger, in some embodiments less than 100 times larger, in some embodiments less than 80 times larger, in some embodiments less than 60 times larger, and in some embodiments less than 50 times larger.

Additionally, in some embodiments, a total exposed area of the input port, output port, and heat sink terminal can be relatively large with respect to a footprint of the filter. The filter can have a footprint area that is less than 20 times larger than a total exposed area of the exposed input port area, the exposed output port area, and the exposed heat sink area, in some embodiments less than about 15 times larger, in some embodiments less than about 10 times larger, and in some embodiments less than 5 times larger.

The monolithic substrate(s) may have a relatively high thermal conductivity, which may improve the device's power handling capabilities. For example, the monolithic substrate can have a thermal conductivity that is greater than about 20 W/m·° C., in some embodiments greater than about 40 W/m·° C., in some embodiments greater than about 80 W/m·° C., and in some embodiments greater than about 100 W/m·° C.

The monolithic substrate(s) and/or dielectric layer(s) may include a material having a dielectric constant that is less than about 30 as determined in accordance with ASTM D2520-13 at an operating temperature of 25° C. and frequency of 500 MHz, in some embodiments less than about 25, in some embodiments less than about 20, and in some embodiments less than about 15. However, in other embodiments, a material having a dielectric constant higher than 30 may be used to achieve higher frequencies and/or smaller components. For example, in such embodiments, the dielectric constant may range from about 30 to about 120, or greater as determined in accordance with ASTM D2520-13 at an operating temperature of 25° C. and frequency of 500 MHz, in some embodiments from about 50 to about 100, and in some embodiments from about 70 to about 90.

For example, the substrate(s) and/or dielectric layers may comprise one or more suitable ceramic materials. Suitable materials are generally electrically insulating and thermally conductive. For example, in some embodiments, the substrate may include sapphire, ruby, alumina ($Al_2O_3$), aluminum nitride (AlN), beryllium oxide (BeO), aluminum oxide ($Al_2O_3$), boron nitride (BN), silicon (Si), silicon carbide (SiC), silica ($SiO_2$), silicon nitride ($Si_3N_4$), gallium arsenide (GaAs), gallium nitride (GaN), zirconium dioxide ($ZrO_2$), mixtures thereof, oxides and/or nitrides of such materials, or any other suitable ceramic material. Additional example ceramic materials include barium titanate ($BaTiO_3$), calcium titanate ($CaTiO_3$), zinc oxide (ZnO), ceramics containing low-fire glass, or other glass-bonded materials.

As used herein, "formed over," may refer to a layer that is directly in contact with another layer. However, intermediate layers may also be formed therebetween. Additionally, when used in reference to a bottom surface, "formed over" may be used relative to an exterior surface of the component. Thus, a layer that is "formed over" a bottom surface may be closer to the exterior of the component than the layer over which it is formed.

The thin-film filter may be configured as a variety of suitable filter types, including, for example, a low pass filter, a high pass filter, or a bandpass filter. The filter may have a characteristic frequency (e.g., a low pass frequency, high pass frequency, an upper bound of a band pass frequency, or a lower bound of a band pass frequency (e.g., a stop band frequency)) that ranges from about 100 MHz to about 5 GHz, or higher, in some embodiments from about 150 MHz to about 4 GHz, in some embodiments from about 200 MHz to about 3 GHz.

The filter may exhibit excellent filtering characteristics. For example, the filter may exhibit excellent out-of-band rejection. The filter may exhibit an attenuation that decreases at a rate that is at least 0.1 dB per MHz from an outer limit of a pass band frequency range, in some embodiments at least 0.15 dB per MHz, in some embodiments at least 0.2 dB per MHz.

As indicated above, the filter may generally be compact. For example, the filter may have a length that is less than about 150 mm, in some embodiments less than about 100 mm, in some embodiments less than about 80 mm, in some embodiments less than about 50 mm, and in some embodiments less than about 40 mm. The filter may have a width that is less than about 100 mm, in some embodiments less than about 60 mm, in some embodiments less than about 40 mm, and in some embodiments less than about 30 mm, and in some embodiments less than about 20 mm.

The filter may be relatively low-profile. For example, the thickness of the filter may be greater than about 100 microns, in some embodiments greater than about 200 microns, in some embodiments greater than about 400 microns, in some embodiments greater than about 600 microns, in some embodiments greater than about 800 microns, in some embodiments greater than about 1 mm, and in some embodiments greater than about 2 mm.

I. The filter may have a number of conductive layers and non-conductive layer forming structures (e.g., inductors, connectors, terminals, etc.) and connections therebetween as described herein. In some embodiments, the filter may have two or more conductive layers, in some embodiments four or more conductive layers, and in some embodiments six or more conductive layers. Example Embodiments FIG. 1A illustrates a simplified schematic of a filter 10 according to aspects of the present disclosure. The filter can include one or more thin-film inductors 12, 14, 16 connected between an input port 18 and an output port 20. The thin-film inductors 12, 14, 16 can be connected in series. One or more capacitors 22, 24, 26, 28 can be connected between the thin-film inductors 12, 14, 16 and a heat sink terminal 30. In some embodiments, the heat sink terminal 30 can act as a ground. In some embodiments, one or more capacitors 32, 34, 36 can be connected in series between the input port 18 and output port 20. The capacitors 32, 34, 36 can respectively be connected in parallel with individual inductors 12, 14, 16. For example a first capacitor 32 can be connected in parallel with a first inductor 12. A second capacitor 34 can be connected in parallel with a second inductor 14. A third capacitor 36 can be connected in parallel with a third inductor 16.

It should be understood that the configuration described above with respect to FIG. 1A is provided as an example only. Variations are possible within the scope of this disclosure. For example, the filter may include a smaller or larger number of inductors. Additionally, some or all capacitors may be omitted to obtain the desired filtering characteristics.

Figure 1B:
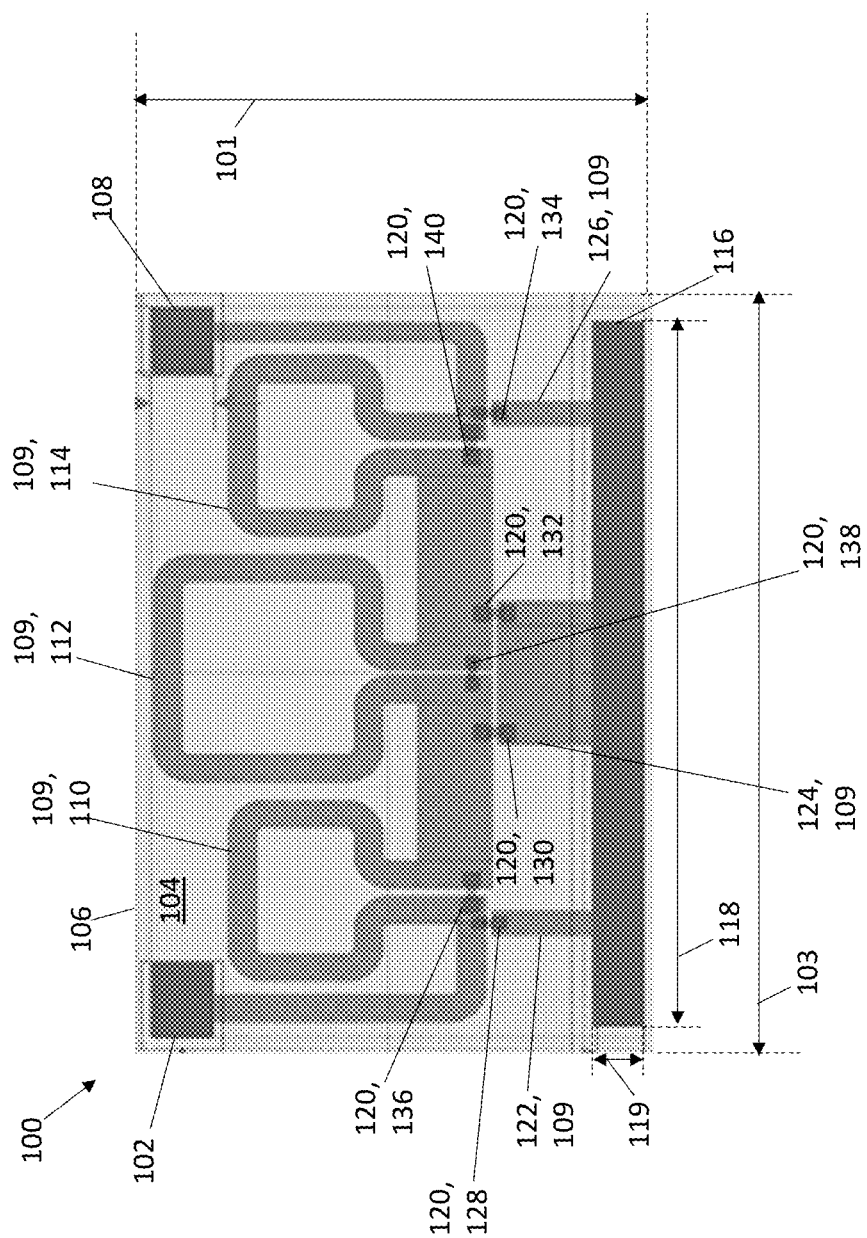
FIG. 1B illustrates a schematic of a thin-film filter according to aspects of the present disclosure.

FIG. 1B illustrates a schematic of a filter 100 according to aspects of the present disclosure. The filter 100 may have a footprint area defined as a length 101 of the filter 100 multiplied by a width 103 of the filter. The filter 100 may include an input port 102 exposed on a surface 104 of a monolithic substrate 106. An output port 108 may also be exposed on the surface 104 of the monolithic substrate 106. A patterned conductive layer 109 can be formed over the monolithic substrate 106. The patterned conductive layer 109 can include one or more thin-film inductors 110, 112, 114. The thin-film inductors 110, 112, 114 can be connected between the input port 102 and the output port 108. In this example the thin-film inductors 110, 112, 114 can include a first thin-film inductor 110, a second thin-film inductor 112, and a third thin-film inductor 114 connected in series between the input port 102 and the output port 108.

The filter 100 can include a heat sink terminal 116 exposed on a bottom surface of the monolithic substrate 106, for example as illustrated in FIG. 10. The heat sink terminal 116 can be configured to mount or attach to a heat sink of a printed circuit board (or other object or surface) to which the filter 100 is mounted. The heat sink terminal 116 can have an exposed heat sink area. For example, the heat sink terminal 116 can have a rectangular shape including a length 118 and a width 120. In this example, the exposed heat sink area can be calculated as the length 118 multiplied by the width 119. However, it should be understood that the exposed heat sink terminal 116 can have a variety of shapes and sizes. For example, the heat sink terminal 116 can have an "L" shape, a "U" shape, or any other suitable shape.

The exposed heat sink area of the heat sink terminal 116 can be relatively large with respect to footprint area the monolithic substrate 106. The heat sink terminal 116 can have a large exposed area to aid with heat removal from the filter 100 (e.g., to a heat sink of the printing circuit board), which can facilitate high power capacity. In some embodiments, the monolithic substrate 106 can have an area that is less than 20 times larger than the exposed heat sink area of the heat sink terminal 116.

In some embodiments, the filter 100 can include one or more capacitors. For example, an additional patterned conductive layer 120 can be spaced apart from the patterned conductive layer 109 of the thin-film inductors 110, 112, 114 in a thickness direction 115, which is perpendicular to the surface 104 of the monolithic substrate 106 and illustrated in FIG. 1C. The additional patterned conductive layer 120 can form one or more capacitors with the patterned conductive layer 109 of the thin-film inductors 110, 112, 114.

For example, the patterned conductive layer 109 of the thin-film inductors 110, 112, 114 can include one or more portions 122, 124, 126 directly connected with the heat sink terminal 116. The additional patterned conductive layer 120 can include a first portion 128, a second portion 130, a third portion 132, and a fourth portion 134 forming capacitors between the thin-film inductors 110, 112 and the heat sink terminal 116. The first portion 128, second portion 130, third portion 132, and fourth portion 134 of the additional patterned conductive layer 120 can respectively correspond with the capacitors 22, 24, 26 of FIG. 1A connected between the inductors 12, 14, 16 and the heat sink terminal 30.

First, the first portion 128 of the additional patterned conductive layer 120 can form a capacitor with the patterned conductive layer 109 of the thin-film inductors 110, 112. The first portion 128 of the additional patterned conductive layer 120 can overlap the patterned conductive layer 109 with respect to a plane of the surface 104 of the monolithic substrate 106 with the patterned conductive layer 109 at a point between the first inductor 110 and the input port 102. The first portion 128 of the additional patterned conductive layer 120 can overlap the first portion 122 of the patterned conductive layer 109. Thus, the first portion 128 of the additional patterned conductive layer 120 can form a capacitor between the patterned conductive layer 109 at a point between the first inductor 110 and the input port 102 and the first portion 122 of the patterned conductive layer 109. The first portion 128 of the additional patterned conductive layer 120 can correspond with capacitor 22 of FIG. 1A.

Similarly, a second portion 130 of the additional patterned conductive layer 120 can overlap the patterned conductive layer 109 at a point between the first inductor 110 and the second inductor 112. The second portion 130 of the additional patterned conductive layer 120 can overlap the second portion 124 of the patterned conductive layer 109. The second portion 130 of the additional patterned conductive layer 120 can thus form a capacitor between the point between the first inductor 110 and the second inductor 112 and the second portion 124 of the patterned conductive layer 109. The second portion 130 of the additional patterned conductive layer 120 can correspond with the capacitor 24 of FIG. 1A.

A third portion 132 of the additional patterned conductive layer 120 can overlap the patterned conductive layer 109 at a point between the second inductor 112 and the third inductor 114. The second portion 130 of the additional patterned conductive layer 120 can overlap the second portion 124 of the patterned conductive layer 109. The third portion 132 of the additional patterned conductive layer 120 can thus form a capacitor between the second portion 124 of the patterned conductive layer 109 and the point between the second inductor 112 and the third inductor 114. The third portion 130 of the additional patterned conductive layer 120 can correspond with capacitor 26 of FIG. 1A.

A fourth portion 134 of the additional patterned conductive layer 120 can overlap the patterned conductive layer 109 at a point between the third inductor 114 and the output port 108. The fourth portion 130 of the additional patterned conductive layer 120 can overlap the third portion 126 of the patterned conductive layer 109. The fourth portion 134 of the additional patterned conductive layer 120 can thus form a capacitor between the second portion 126 of the patterned conductive layer 109 and the point between the third inductor 114 and the output port 108. The fourth portion 130 of the additional patterned conductive layer 120 can correspond with capacitor 28 of FIG. 1A. Accordingly, the first portion 128, second portion 130, third portion 132, and fourth portion 134 of the additional patterned conductive layer 120 can respectively correspond with the capacitors 22, 24, 26 of FIG. 1A.

The additional patterned conductive layer 120 can include a fifth portion 136, sixth portion 138, and seventh portion 140 that can form capacitors respectively corresponding with the capacitors 32, 34, 36 of FIG. 1A. The capacitors can be respectively connected in parallel with respective inductors 110, 112, 114. More specifically, the fifth portion 136 can overlap the patterned conductive layer 109 at a point between the first inductor 109 and the input port 102 and also overlap the patterned conductive layer 109 at a point between the first inductor 110 and the second inductor 112. The sixth portion 138 can overlap the patterned conductive layer 109 at a point between the first inductor 109 and the second inductor 112 and also overlap the patterned conductive layer 109 at a point between the second inductor 112 and the third inductor 114. Lastly, the seventh portion 140 of the additional patterned conductive layer 120 can overlap the patterned conductive layer 109 at a point between the second inductor 112 and the third inductor 114 and also overlap the patterned conductive layer 109 at a point between the third inductor 114 and the output port 108.

Figure 1C:
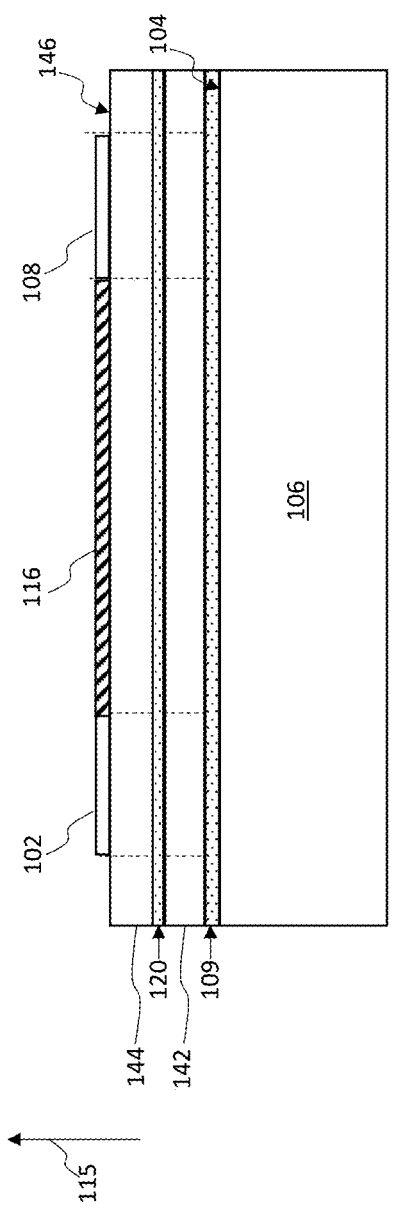
FIG. 1C is a schematic side elevation view of the thin-film filter of FIG. 1B.

FIG. 1C is a schematic side elevation view of the filter 100 of FIG. 1B. As shown in FIG. 1C, the patterned conductive layer 109 can be arranged over the surface 104 of the monolithic substrate 106. A first layer 142 (e.g., of dielectric material) can be arranged over the monolithic substrate 106 and the patterned conductive layer 109. The additional patterned conductive layer 120 can be formed on and/or arranged over the first layer 142. In some embodiments, a second layer 144 can be arranged over the additional patterned conductive layer 120 and the first layer 142. The input port 102, output port 108, heat sink terminal 116 can be exposed along a bottom surface 146 of the filter 100. As discussed above, the filter 100 can be configured as a "flip chip" such that the filter 100 can be flipped 180 degrees from the orientation shown in FIG. 1C when it is surface mounted (e.g., to a printed circuit board) such that the ports 102, 108 are arranged to contact the mounting surface.

Figure 2A:
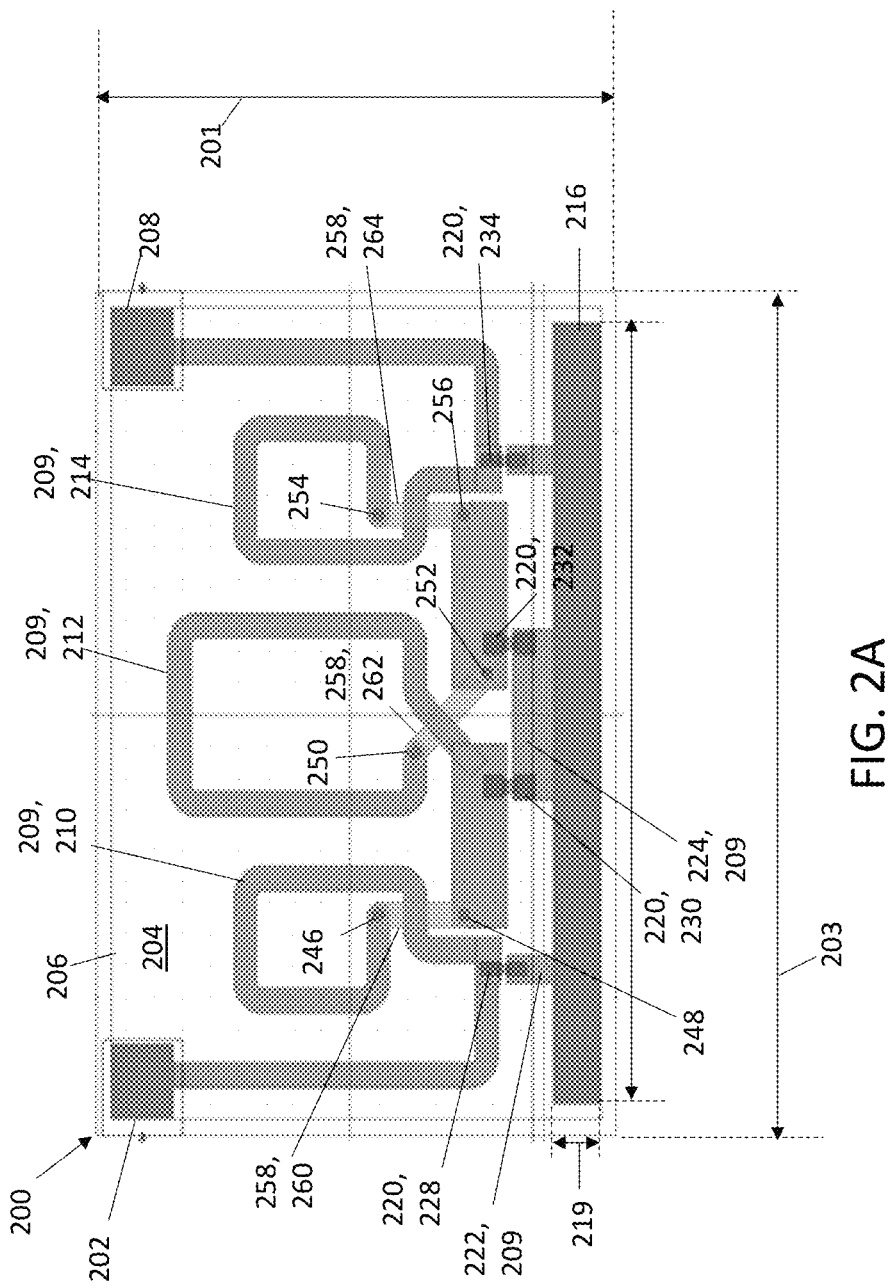
FIG. 2A is a top down schematic view of another embodiment of a thin-film filter according to aspects of the present disclosure.

FIG. 2A is a top down schematic view of another embodiment of a filter 200 according to aspects of the present disclosure. The filter 100 may have a footprint area defined as a length 101 of the filter 100 multiplied by a width 103 of the filter. The filter 200 may generally be configured similarly to the filter 100 of FIG. 1. The reference numerals of FIGS. 2A and 2B generally correspond to reference numerals of FIG. 1. For example, the input port 202 of the filter 200 of FIG. 2A corresponds with the input port 102 of the filter 100 of FIG. 1; the surface 204 of the monolithic substrate 206 of the filter 200 of FIG. 2A corresponds with the monolithic substrate 106 of the filter 100 of FIG. 1, and so forth.

In contrast with the filter 100 of FIG. 1, the filter 200 of FIG. 2 can be free of capacitors corresponding with the capacitors 32, 34, 36 of FIG. 1A. In other words, the filter 200 of FIG. 2A can be free of capacitors that are connected in parallel with respective inductors 210, 212, 214. However, it should be understood that, in some embodiments, such capacitors could be included in the filter 200 of FIG. 2A within the scope of this disclosure.

Additionally, the inductors 210, 212, 214 of the filter 200 of FIG. 2A can be formed in more than one patterned conductive layer and connected by vias 246, 248, 250, 252, 254, 256. For example, a third patterned conductive layer 258 can include a first portion 260, a second portion 262, and a third portion 264 respectively forming portions of loops of the inductors 210, 212, 214. The portions 260, 262, 264 of the third layer 258 can be connected with a patterned conductive layer 209 (e.g., corresponding with the patterned conductive layer 109 of the filter 100 of FIGS. 1B and 1C) by the vias 246, 248, 250, 252, 254, 256 as shown in FIG. 2A.

Figure 2B:
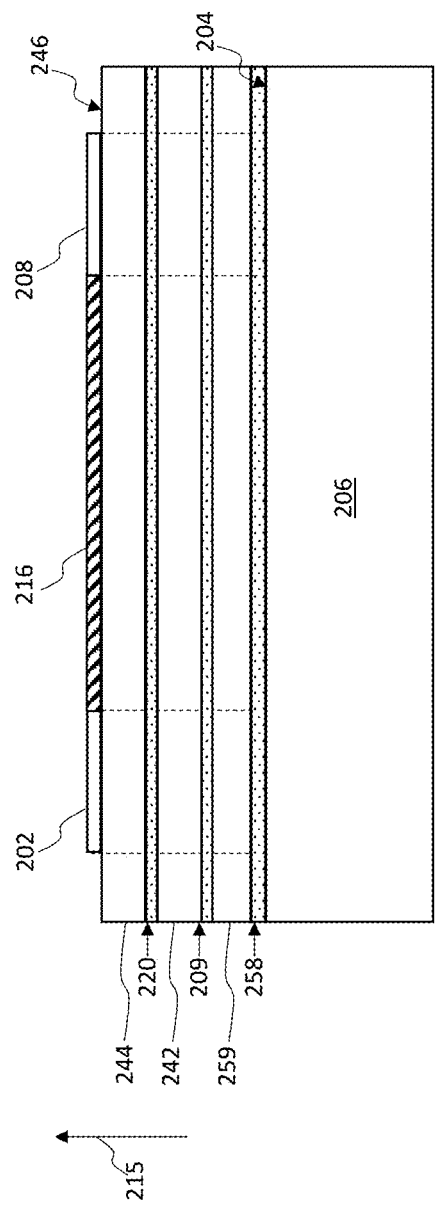
FIG. 2B is a schematic side elevation view of the thin-film filter of FIG. 2A.

FIG. 2B is a schematic side elevation view of the filter 200 of FIG. 2A. As shown in FIG. 2B, the filter can include the third layer 258, which can be arranged over the monolithic substrate 206 (e.g., between the first patterned conductive layer 209 and the monolithic substrate 206). The first patterned conductive layer 209 can correspond with the patterned conductive layer 109 of the filter 100 of FIGS. 1B and 1C). A third layer 259 (e.g., of dielectric material) can be arranged over the monolithic substrate 206 and the third patterned conductive layer 258. However, it should be understood that any suitable arrangement of dielectric layers and patterned conductive layers can be used to achieve the filter configuration described with respect to FIG. 2A.

II. Simulation Data

Figure 3:
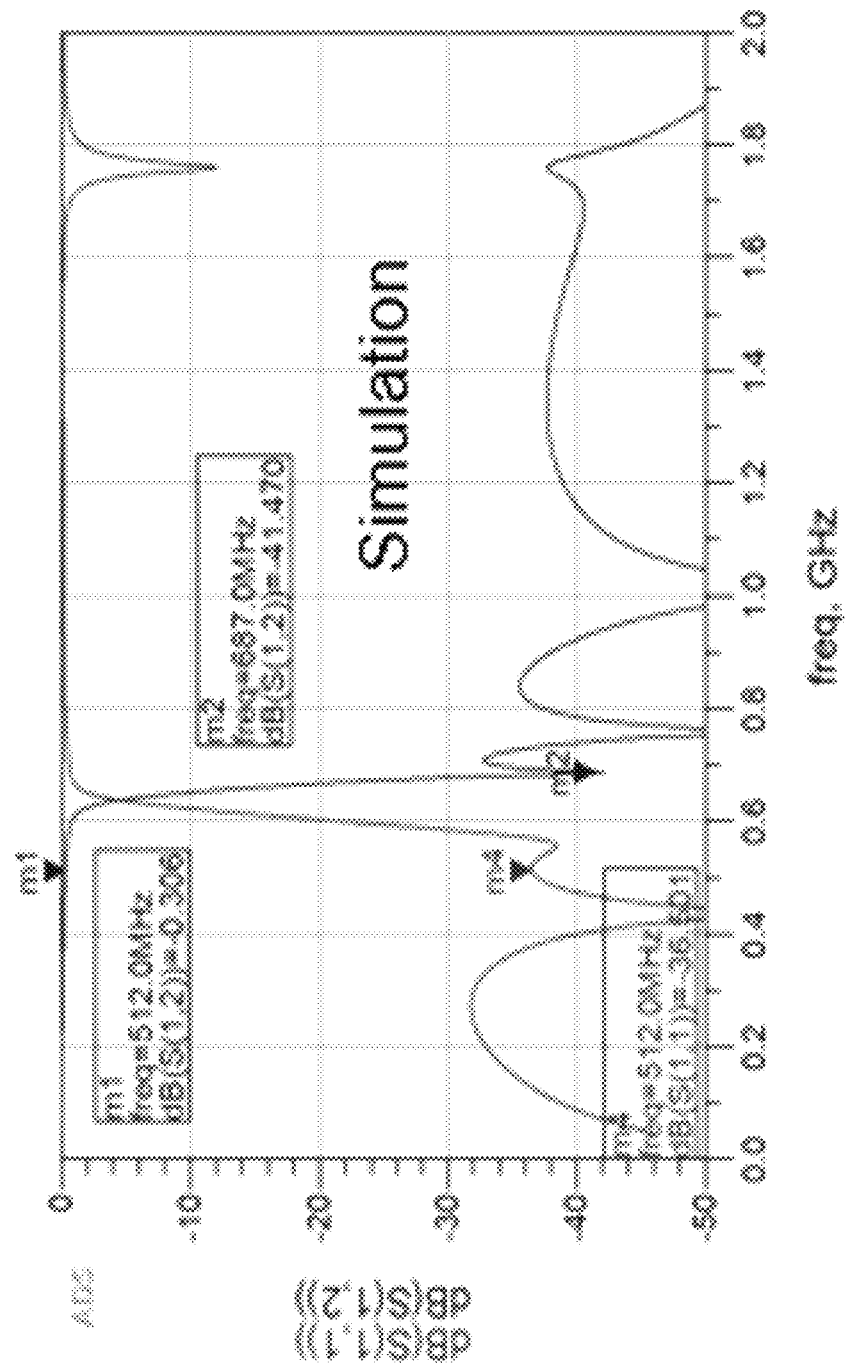
FIG. 3 illustrates simulated insertion loss ($S_{2,1}$) and return loss ($S_{1,1}$) data for a low pass thin-film filter according to aspects of the present disclosure.

FIG. 3 illustrates simulated insertion loss ($S_{2,1}$) and return loss ($S_{1,1}$) data for a low pass filter according to aspects of the present disclosure. The simulation data shows excellent attenuation above a low pass cutoff frequency of 512 MHz. More specifically, FIG. 5 shows a steep drop past the low pass cutoff frequency. In this example, the insertion loss ($S_{2,1}$) is −0.306 dB at 512 MHz with an attenuation of −41.47 dB at 687.0 MHz. For frequencies above about 700 MHz the attenuation is less than −30 dB.

III. Testing

A. Response Characteristics

Testing for insertion loss, return loss, and other response characteristics may be performed using a source signal generator (e.g., a 1306 Keithley 2400 series Source Measure Unit (SMU), for example, a Keithley 2410-C SMU). For example, to measure an S-parameter (e.g., insertion loss, return loss, etc.) an input signal may be applied to the input port of the filter, and an output signal may be measured at the output port of the filter using the source signal generator.

B. Response Characteristics

Testing for power capacity may be performed using a source signal generator (e.g., a 1306 Keithley 2400 series Source Measure Unit (SMU), for example, a Keithley 2410-C SMU) and an infrared thermometer. The power capacity of the filter may be defined as the power level at which the filter has a steady state temperature of about 75° C. in an ambient environment of about 23° C. To measure power capacity, the filter may be subjected to a test signal having a sinusoidal frequency of 500 MHz having a DC bias voltage of 0 V using source signal generator (e.g., a 1306 Keithley 2400 series Source Measure Unit (SMU), for example, a Keithley 2410-C SMU). The power level of the test signal can be incrementally increased (e.g., by 10 Watts) in an environment that is about 23° C. The filter assembly can be allowed to reach a steady state temperature at each steady state power level. Each steady state temperature of the filter can be measured using an infrared thermometer. The process can be repeated until the temperature of the filter exceeds 75° C. The power level just prior to the filter exceeding 75° C. can be determined to be the power capacity of the filter.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A thin-film filter comprising:
   a monolithic substrate;
   a patterned conductive layer formed over the monolithic substrate, the patterned conductive layer comprising at least one thin-film inductor; and
   a heat sink terminal exposed on a bottom surface of the filter, the heat sink terminal having an exposed heat sink area;
   wherein a footprint area of the filter is less than 20 times larger than the exposed heat sink area; and
   wherein the thin-film filter has a power capacity that is greater than about 25 W.

2. The thin-film filter of claim 1, wherein the footprint area is less than about 50 cm$^2$.

3. The thin-film filter of claim 1, wherein the thin-film filter has an area power capacity that is greater than about 0.02 W/mm$^2$.

4. The thin-film filter of claim 1, wherein the thin-film inductor has a thickness that is greater than about 30 micrometers.

5. The thin-film filter of claim 1, wherein the thin-film filter exhibits an attenuation that is less than −30 dB above a stop band frequency.

6. The thin-film filter of claim 1, further comprising:
   an input port exposed on a bottom surface of the filter, the input port having an exposed input port area; and
   an output port exposed on the bottom surface of the filter, the output port having an exposed output port area;
   wherein the footprint area of the filter is less than 20 times larger than a total exposed area of the exposed input port area, the exposed output port area, and the exposed heat sink area.

7. The thin-film filter of claim 6, wherein the at least one thin-film inductor comprises a plurality of thin-film inductors connected in series between the input port and the output port.

8. The thin-film filter of claim 1, wherein the at least one thin-film inductor comprises at least two patterned conductive layers spaced apart from each other in a thickness direction of the thin-film filter.

9. The thin-film filter of claim 1, further comprising:
   an additional patterned conductive layer spaced apart from the patterned conductive layer in a thickness direction of the thin-film filter, the additional patterned conductive layer forming a capacitor with the patterned conductive layer and the heat sink terminal.

10. The thin-film filter of claim 1, wherein the monolithic substrate comprises sapphire.

11. The thin-film filter of claim 1, wherein the monolithic substrate has a thermal conductivity of greater than 20 W/m·° C.

12. The thin-film filter of claim 1, wherein the at least one thin-film inductor comprises a patterned conductive layer shaped in a loop that is formed entirely on a single layer.

13. A method for forming a thin-film filter comprising:
providing a monolithic substrate;
forming a patterned conductive layer formed over the monolithic substrate, the patterned conductive layer comprising at least one thin-film inductor, the at least one thin-film inductor connected between an input port exposed on a bottom surface of the thin-film filter and an output port exposed on the bottom surface of the thin-film filter; and
forming a heat sink terminal exposed along the bottom surface of the thin-film filter, the heat sink terminal having an exposed heat sink area;
wherein a footprint area of the filter is less than 20 times larger than the exposed heat sink area.

14. A thin-film filter comprising:
a monolithic substrate;
an input port exposed on a bottom surface of the thin-film filter;
an output port exposed on the bottom surface of the thin-film filter;
a patterned conductive layer formed over the monolithic substrate, the patterned conductive layer comprising at least one thin-film inductor, the at least one thin-film inductor connected between the input port and the output port; and
a heat sink terminal exposed along the bottom surface of the thin-film filter;
wherein the heat sink terminal has an exposed heat sink area, and wherein a footprint area of the thin-film filter is less than 20 times larger than the exposed heat sink area.

15. The thin-film filter of claim 14, wherein the thin-film filter exhibits an attenuation that is less than −30 dB above a stop band frequency.

16. The thin-film filter of claim 14, wherein the footprint area is less than about 50 cm$^2$.

17. The thin-film filter of claim 14, wherein the thin-film filter has an area power capacity that is greater than about 0.02 W/mm$^2$.

18. The thin-film filter of claim 14, wherein the thin-film inductor has a thickness that is greater than about 30 micrometers.

19. The thin-film filter of claim 14, wherein:
the input port has an exposed input port area;
the output port has an exposed output port area; and
the footprint area of the filter is less than 20 times larger than a total exposed area of the exposed input port area, the exposed output port area, and the exposed heat sink area.

20. The thin-film filter of claim 14, wherein the heat sink terminal has a heat sink length in a first direction and the monolithic substrate has a length in the first direction that is less than twice the heat sink length.

21. The thin-film filter of claim 20, wherein the at least one thin-film inductor comprises a plurality of thin-film inductors connected in series between the input port and the output port.

22. The thin-film filter of claim 20, further comprising an additional patterned conductive layer spaced apart from the patterned conductive layer in a thickness direction of the thin-film filter, the additional patterned conductive layer forming a capacitor with the patterned conductive layer and the heat sink terminal.

23. The thin-film filter of claim 14, wherein the monolithic substrate comprises sapphire.

24. The thin-film filter of claim 14, wherein the monolithic substrate has a thermal conductivity of greater than 20 W/m·° C.

25. The thin-film filter of claim 14, wherein the at least one thin-film inductor comprises a patterned conductive layer shaped in a loop that is formed entirely on a single layer.

26. The thin-film filter of claim 14, wherein the at least one thin-film inductor comprises at least two patterned conductive layers spaced apart from each other in a thickness direction of the thin-film filter.

* * * * *